United States Patent
Mullarkey et al.

[19]

[11] Patent Number: 6,141,276

[45] Date of Patent: Oct. 31, 2000

[54] APPARATUS AND METHOD FOR INCREASING TEST FLEXIBILITY OF A MEMORY DEVICE

[75] Inventors: Patrick J. Mullarkey, Meridian; Michael A. Shore, Boise, both of Id.

[73] Assignee: Micron Technology, Inc., Boise, Id.

[21] Appl. No.: 09/389,680

[22] Filed: Sep. 2, 1999

[51] Int. Cl.$^7$ .......................................................... G11C 7/00
[52] U.S. Cl. ........................................... 365/203; 365/201
[58] Field of Search .................................. 365/201, 203, 365/230.06, 233

[56] References Cited

U.S. PATENT DOCUMENTS

| | | | |
|---|---|---|---|
| 5,757,705 | 5/1998 | Manning | 365/201 |
| 5,986,955 | 11/1999 | Siek et al. | 365/203 |
| 5,995,426 | 11/1999 | Cowles et al. | 365/201 |
| 5,995,430 | 11/1999 | Yabe | 365/203 |

*Primary Examiner*—Trong Phan
*Attorney, Agent, or Firm*—Dorsey & Whitney LLP

[57] ABSTRACT

Operation control circuitry for altering a sequence of internal memory operations in a memory device while in a test mode. The operation control circuitry includes a code circuit for providing an operation code in accordance to a user programmable code. An operation control circuit generates operation control signals in response to receiving command signals from a command circuit included in the operation control circuitry. The operation control signals generated by the operation control circuit control the occurrence of the internal memory operations according to an operation code.

43 Claims, 6 Drawing Sheets

APPARATUS AND METHOD FOR INCREASING TEST FLEXIBILITY OF A MEMORY DEVICE

TECHNICAL FIELD

The present invention relates generally to the testing of semiconductor memories, and more specifically to a method and apparatus for increasing the flexibility of testing memory devices.

BACKGROUND OF THE INVENTION

During the manufacture of semiconductor memories, such as a synchronous dynamic random access memories ("SDRAMs"), it is necessary to test each memory cell to ensure it is operating properly. Electronic and computer systems containing semiconductor memories also normally test the memories when power is initially applied to the system.

A conventional memory device is illustrated in FIG. 1. The memory device is an SDRAM 10 which includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory bank arrays 20 and 22 depending upon the state of a bank address bit forming part of the row address. The arrays 20 and 22 are comprised of memory cells arranged in rows and columns. Associated with each of the arrays 20 and 22 is a respective row address latch 26, which stores the row address, and a row decoder 28, which applies various signals to its respective array 20 or 22 as a function of the stored row address. The row address multiplexer 18 also couples row addresses to the row address latches 26 for the purpose of refreshing the memory cells in the arrays 20 and 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address output by the address register 12. In either case, the column address buffer 44 applies a column address to a column decoder 48, which applies various column signals to respective sense amplifiers and associated column circuits 50 and 52 for the respective arrays 20 and 22.

Data to be read from one of the arrays 20 or 22 are coupled from the arrays 20 or 22, respectively, to a data bus 58 through the column circuit 50 or 52, respectively, and a read data path that includes a data output register 56. Data to be written to one of the arrays 20 or 22 are coupled from the data bus 58 through a write data path, including a data input register 60, to one of the column circuits 50 or 52 where they are transferred to one of the arrays 20 or 22, respectively. A mask register 64 may be used to selectively alter the flow of data into and out of the column circuits 50 and 52 by, for example, selectively masking data to be read from the arrays 20 and 22.

The above-described operation of the SDRAM 10 is controlled by a command decoder 68 responsive to high level command signals received on a control bus 70. These high level command signals, which are typically generated by the memory controller, are a clock enable signal CKE*, a clock signal CLK, a chip select signal CS*, a write enable signal WE*, a row address strobe signal RAS*, and a column address strobe signal CAS*, where the "*" designates the signal as active low. The command decoder 68 generates a sequence of control signals responsive to the high level command signals to carry out a function (e.g., a read or a write) designated by each of the high level command signals. The control signals include signals to activate rows of memory cells in the arrays 20, 22, signals to equilibrate digit lines in the arrays 20, 22, and signals to apply power to sense amplifiers in the column circuits 50, 52. These control signals, and the manner in which they accomplish their respective functions, are conventional. Therefore, in the interest of brevity, a further explanation of these control signals will be omitted.

During testing of the SDRAM 10, each memory cell must be tested to ensure it is operating properly. In order to facilitate testing high capacity SDRAMs, test modes have been employed that allow reading and writing operations to be performed on multiple arrays simultaneously, thus reducing the time required to test every memory cell. Generically, a test mode allows the normal operation of the SDRAM to be suspended during the time the device is in the test mode. To test the memory cells, a memory tester applies address, data, and control signals to the SDRAM to place the device in test mode, and write data to and read data from all the memory cells in the arrays. In a typical prior art test method, data having a first binary value (e.g., a "1") is written to and read from all memory cells in the arrays, and thereafter data having a second binary value (e.g., a "0") is typically written to and read from the memory cells. The memory tester determines a memory cell is defective when the data written to the memory cell does not equal the data read from the memory cell.

Although the test method described above may be effective in determining the gross functionality of the SDRAM, it would be ineffective in identifying other failure mechanisms. For example, if the row and column address decoders of the SDRAM were defective and could address only a limited number of the cells in the entire array, the SDRAM device would nevertheless pass the test pattern described above. However, if complementary data were written to each cell immediately after being read, instead of reading through the entire array before writing new data, the memory tester would have detected an error, and identify the SDRAM as a defective memory device. Such a test pattern is generally referred to as a "MARCH" test, and may be performed by incrementing or decrementing through the available memory cell addresses. Thus, as illustrated by the previous example, various other data test patterns, as well as different signal timing, may be applied by the memory tester during testing of the SDRAM to identify different failure mechanisms.

In addition to testing the functionality of the SDRAM, various test patterns and timing may also be used to measure various performance characteristics of the SDRAM. One example is measuring the maximum data retention time of the memory cells of the SDRAM. A "checkerboard" pattern may be written to the array so that physically adjacent memory cells have opposite data polarities. Such a pattern creates a condition where adjacent memory cells may influence leakage currents. After a predetermined delay time, the tester begins reading the array to check if the polarity of any of the cells has changed. The test is repeated with progressively longer delay times until the SDRAM fails. The corresponding delay time is taken to be an approximation of the device's maximum data retention time.

In spite of the various data patterns and signal timing that may be applied by the memory tester to the SDRAM during testing, there may be subtle failure mechanisms and performance characteristics that are difficult, if not impossible, to test or measure. These marginal failure mechanisms may be masked by the inherent operation of the SDRAM itself. That is, a sequence of internal operations that occur after a command is initiated by the SDRAM may be carried out in a manner that prevents a marginal failure from being detected. For example, marginal failures related to signal line coupling, or signal line shorting are some examples of the type of failure mechanisms that may be hidden during the normal operation of the SDRAM. As a consequence, an SDRAM may pass functional testing and burn-in testing, but the marginal failure mechanism may continue to degrade until the SDRAM fails in the field.

Therefore, there is a need for a method and apparatus that increases the flexibility of testing memory devices.

SUMMARY OF THE INVENTION

In accordance with the present invention, an operation control circuit for altering a sequence of internal memory operations in a memory device while in a test mode is provided. The operation control circuit generates operation control signals in response to receiving command signals from a command circuit. The operation control signals generated by the operation control circuit control the occurrence of the internal memory operations according to an operation code. A code circuit provides the operation code in accordance with a user programmable code.

DETAILED DESCRIPTION OF THE INVENTION

Figure 1:
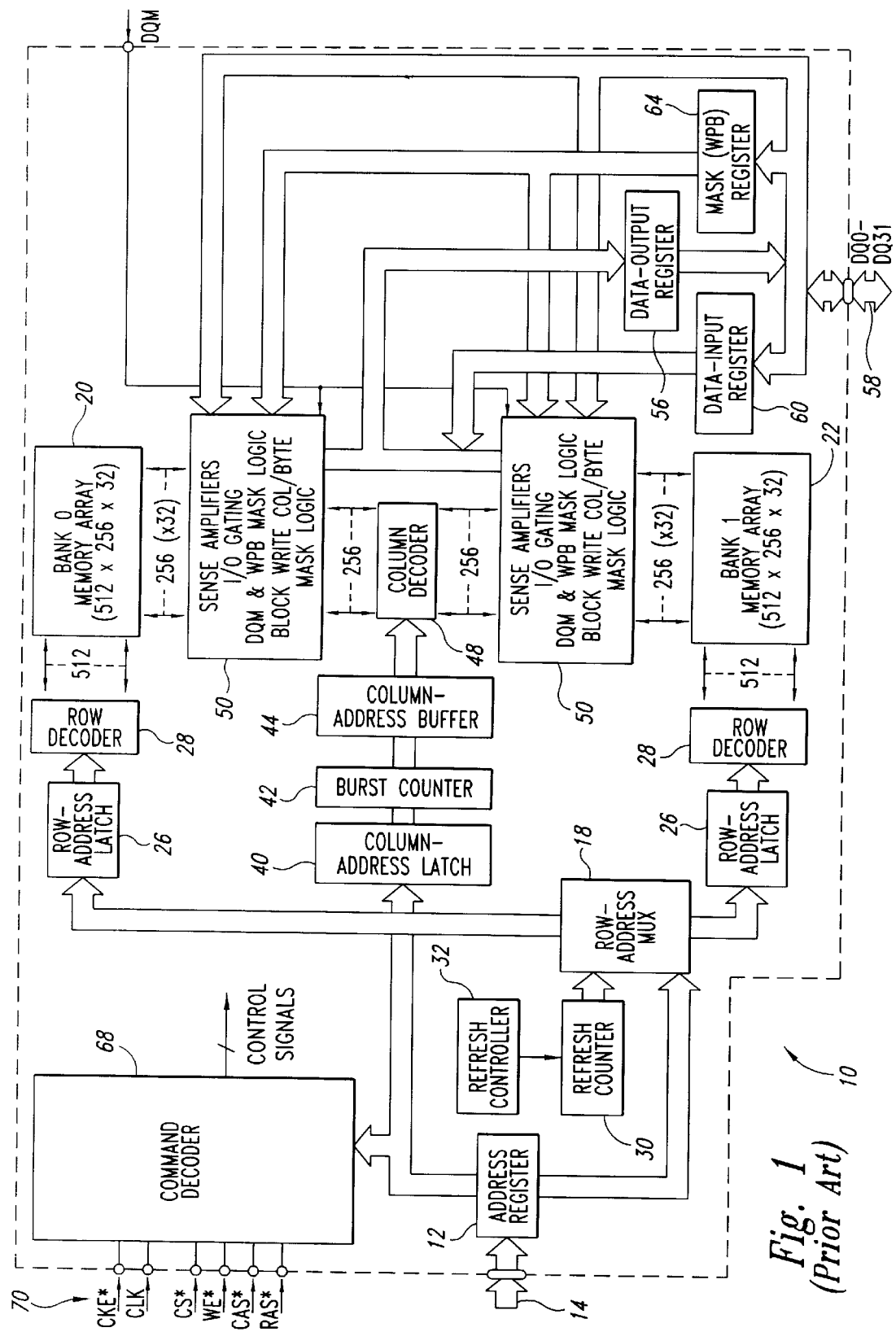
FIG. 1 is a block diagram of a memory device according to the prior art.
Figure 2:
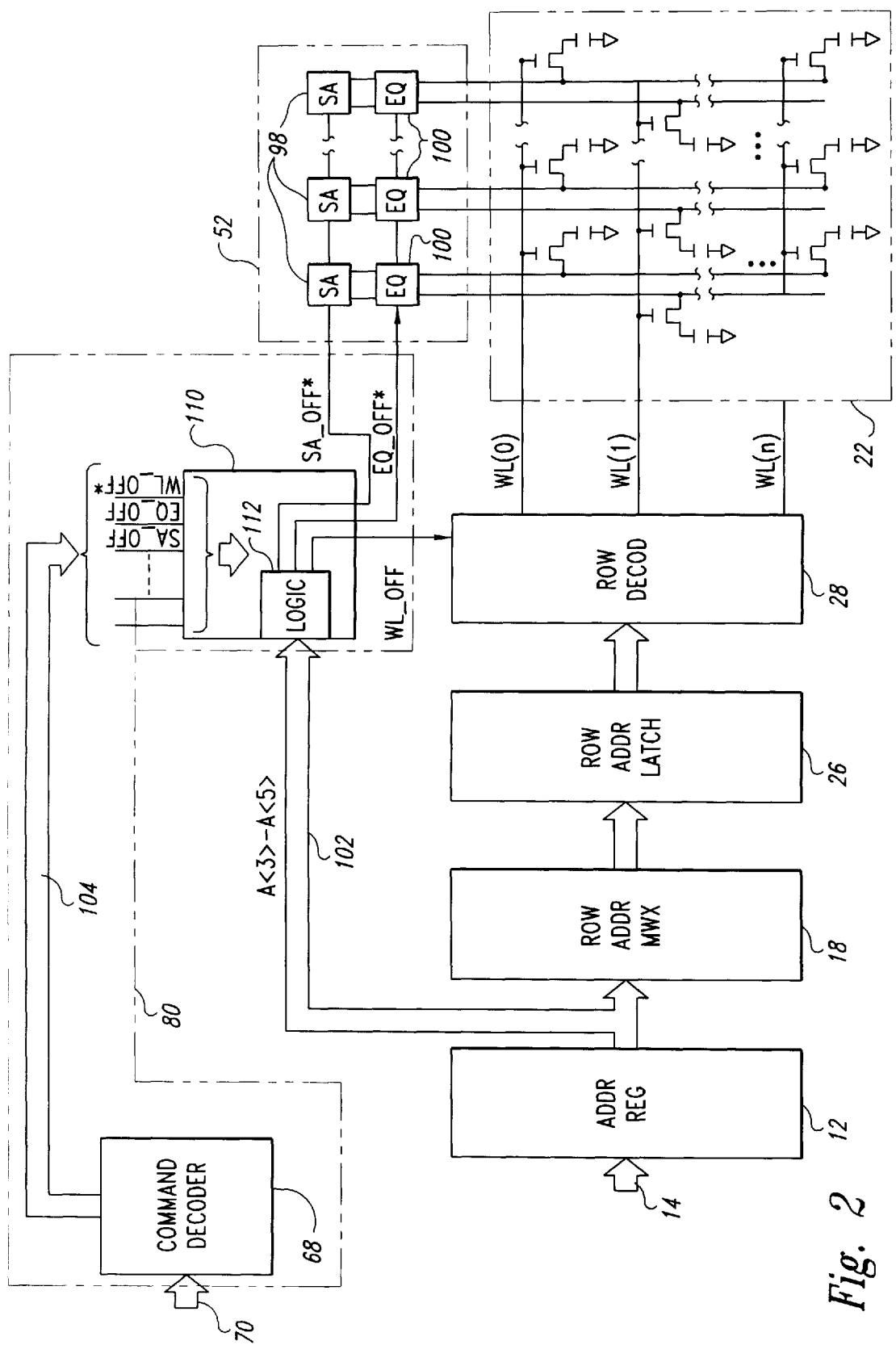
FIG. 2 is a block diagram of a portion of a memory device including precharge control circuitry according to an embodiment of the present invention.

An embodiment of a command decoder 80 in accordance with the invention is illustrated in FIG. 2 along with some of the components of the SDRAM 10 of FIG. 1. The command decoder 80 may be used in the SDRAM 10 of FIG. 1 in place of the command decoder 68.

The command decoder 80 includes the conventional command decoder 68 used in the SDRAM 10 of FIG. 1 and a precharge control circuit 110, which is not used in the conventional SDRAM 10 of FIG. 1. As explained above, the command decoder 68 receives command signals on a control bus 84 and generates a sequence of control signals responsive to the command signals in order to carry out the requested operation. As also mentioned previously, these control signals, and the manner in which they accomplish their respective functions, are conventional. A row address coupled through the address register 12 and row address multiplexer 18 is stored in the row address latch 26, as explained above. The address is provided to the row decoder 28 that is coupled to word lines in the memory array 22. A row of memory cells corresponding to the row address is accessed when the row decoder 28 activates the selected word line. Depending on the command signals provided to the command decoder 80, the resulting control signals generated by the command decoder 80 cause various operations to be performed to the accessed row. For example, data may be read from or written to one or more of the cells of the accessed row. Although omitted from FIG. 2, the additional circuitry for performing a read or write command is well known, and will not be discussed herein.

It will also be understood that the control signals generated by the command decoder 80 also control the operation of the other array 20 and its associated row address latch 26, row decoder 28 and column circuit 52, which have been omitted from FIG. 2 in the interests of clarity and brevity.

When a word line of the array 22 is activated, each of the memory cells of the accessed row are coupled to a respective digit line of a complementary pair of digit lines. Each complementary pair of digit lines is coupled to a respective sense amplifier 98 in the column circuit 52. The sense amplifiers 98 may be of any well known or hereafter developed sense amplifier design. The sense amplifiers 98 are activated following the activation of the word line. When activated, each sense amplifier 98 detects a potential difference caused by the memory cells being coupled to the digit lines, and amplifies the difference between the complementary digit line pair. Thus, after a row of the array 96 has been accessed, the digit lines of each complementary pair are at opposite logic values, with the digit line coupled to the accessed cell having the logic value of the stored data.

After the row access is completed, the accessed row is typically returned to a standby state by issuing a precharge command to the command decoder 68. The command decoder 68 generates a sequence of control signals to initiate a series of precharge events, collectively referred to as "precharge." A typical sequence of precharge events is deactivating the word line of the accessed row, deactivating the sense amplifiers, and equilibrating the digit lines in preparation for a subsequent row access. A respective equilibration circuit 100 is coupled to each complementary pair of digit lines in order to set the potential of the digit lines to a predetermined value, for example, one-half the operating voltage, VCC/2, and to couple the digit lines together to balance any potential differences. The equilibration circuits 100 may be designed according to any equilibration circuit well known in the art or developed in the future. A VCC/2 generator (not shown) provides the potential of a predetermined value. A person of ordinary skill in the art will appreciate that there may be additional precharge events that occur upon receiving a precharge command, however, the specific precharge events which will be discussed herein will include: (1) deactivating the word line; (2) deactivating the sense amplifiers; and (3) activating the equilibration circuits.

As mentioned previously, many conventional SDRAM devices may be programmed into a test mode to facilitate production level testing. During test mode, the normal operation of the device may be altered in order to accommodate testing of the SDRAM. The command decoder 80 is similar to conventional command decoder 68 in that it may be programmed into a test mode. However, the command decoder 80 further includes the precharge control circuit 110 that may be used during the test mode to control the individual precharge events independently of one another. That is, the typical sequence of precharge events of the conventional command decoder 68 may be altered when the precharge control circuit 110 is enabled during the test mode. The precharge control circuit 110 provides greater flexibility when testing the SDRAM 10, and may be used to discern marginal failure modes that escape detection during gross functional testing.

The precharge control circuit 110 is coupled to the command decoder 68 through a precharge command bus 104 to receive control signals which enable the use of the precharge control circuit 110. For example, the command decoder 68 may provide a test key to the precharge control circuit 110 indicating that the SDRAM 10 is currently in a test mode. As illustrated in FIG. 2, the command generator also provides to the precharge control circuit 110 on the precharge command bus 104 a WL_OFF* signal to deactivate the word line of a selected row, a SA_OFF signal to deactivate the sense amplifiers, and an EQ_OFF to suppress the activation of the equilibration circuits 100. A logic circuit 112 included in the precharge control circuit 110 is coupled to the precharge command bus 104 to receive the control signals. Based on a test mode selected as explained below, the precharge control circuit 110 provides from the control signals a WL_OFF signal, a SA_OFF* signal and an EQ_OFF* signal, respectively. The SA_OFF* and EQ_OFF* signals are active when at a low logic level, as indicated by the asterisk. The three control signals in the present example allow each of the three aforementioned precharge events to be controlled independently from one another, and thus, the sequence of the precharge events may be altered while the SDRAM 10 is in the test mode.

The precharge control circuit 110 is also coupled through a precharge code bus 102 to the address register 12. The logic circuit 112 is coupled to the precharge code bus 102 as well. The address signals received over the precharge code bus 102 will be used as precharge codes to program the precharge control circuit 110 in order to generate the appropriate control signals to suppress or enable the individual precharge events. As shown in FIG. 2, each of the three address signals, A<3>, A<4>, and A<5> are provided to the precharge control circuit 110 and assigned to control a particular precharge event.

In the present example, the address signals are assigned as follows:

A<3>=0, word line OFF; A<3>=1, word line ON

A<4>=0, sense amplifiers OFF; A<4>=1, sense amplifiers ON

A<5>=0, equilibrate ON; A<5>=1, equilibrate OFF

The status of the address signals when the address pins A<3>–A<5> are strobed will dictate the control signals the precharge control circuit will produce.

It can be appreciated that although the precharge control circuit 110 and the logic circuit 112 are shown as producing three different control signals, producing less or additional control signals to control other precharge events would be within the scope of the present invention. For example, where the sense amplifiers consists of a p-channel sense amplifier and an n-channel sense amplifier, two different control signals may be generated by the precharge control circuit 10 to deactivate each of the two sense amplifiers individually.

Furthermore, it can also be appreciated that the choice of which signal pins to strobe for the precharge code is limited to the pins left unused during the modified precharge command. Address pins A<3>–A<5> were selected for the purposes of providing an example. However, the precharge control circuitry may be designed to even strobe data pins if unused during the modified precharge command. Additional bits may be added to the precharge code if additional precharge events were to be controlled by the precharge control circuit 110. Similarly, the number of bits in the precharge code may be reduced if fewer precharge events are to be controlled by the precharge control circuit 110. The particular pins to which the precharge code is applied, or length of the precharge code are details that may be modified and still remain within the scope of the present invention.

For example, in an embodiment of the present invention, the precharge control circuit 110 generates only two control signals, namely, WL_OFF and SA_OFF*. Rather than having an individual code signal for each separate precharge event, a single signal, A<10>, is used to determine the logic states of both WL_OFF and SA_OFF*. That is, the WL_OFF signal may be used to deactivate the word lines independently of deactivating the sense amplifiers 98 and activating the equilibration circuits 100. The WL_OFF signal is active and the SA_OFF* signal is inactive when A<10> is high and the command decoder 68 receives a modified precharge command and provides the precharge control circuit 110 with a test key. However, if A<10> is low, then the SA_OFF* signal is active and the WL_OFF signal is inactive.

An embodiment of the precharge control circuit 110 such as this may be used during a "sticky row" test. That is, multiple active word lines of an array are simultaneously deactivated during the test, and common data is stored in all the cells coupled to the active word lines. However, the active word lines may not be pulled below the threshold voltage of the cell transistors before the equilibration circuits 100 becomes active, thus destroying the common data written to the multiple rows of cells. As a means of overcoming this problem, the precharge control circuit 110 generating the WL_OFF and the SA_OFF* signals can be used to suppress the activation of the equilibration circuits before the multiple word lines are sufficiently deactivated. A test key indicating a sticky row test is provided to the precharge control circuit 110 when a modified precharge command is issued to the command decoder 80. A high A<10> signal will allow the multiple word lines to deactivate without the sense amplifiers 98 deactivating and the equilibration circuit 100 activating, thus, avoiding any problems related to premature equilibration.

In operation, the SDRAM 10 of FIG. 1 using the command decoder 80 of FIG. 2 is placed into the test mode prior to issuing a modified precharge command. The modified precharge command is then issued to the command decoder 80 to indicate that the precharge control circuit 110 should be enabled, and the precharge events will be controlled by the precharge code present on the address pins A<3>–A<5>. The address signals A<3>–A<5> are strobed each time a modified precharge command is issued to the command decoder 80. In response to the precharge code, the precharge control circuit 110 will produce the appropriate control signals, WL_OFF, SA_OFF*, and EQ_OFF*, to execute the request. These control signals, and the manner in which the precharge control circuit 110 produces them, may be accomplished through conventional logic circuitry represented by the logic circuit 112.

Example applications of the SDRAM 80 are described in further detail with reference to the flowcharts of FIGS. 3–5. The following tests may be used to detect marginal failure mechanisms that escape gross functional testing, but nevertheless affect the performance of the SDRAM 80. The particular tests are provided as examples of how some, or all, of the principles of the present invention may be applied. There are many other test variations that are possible, but in the interests of brevity, only a few particular tests have been provided herein.

Figure 3:
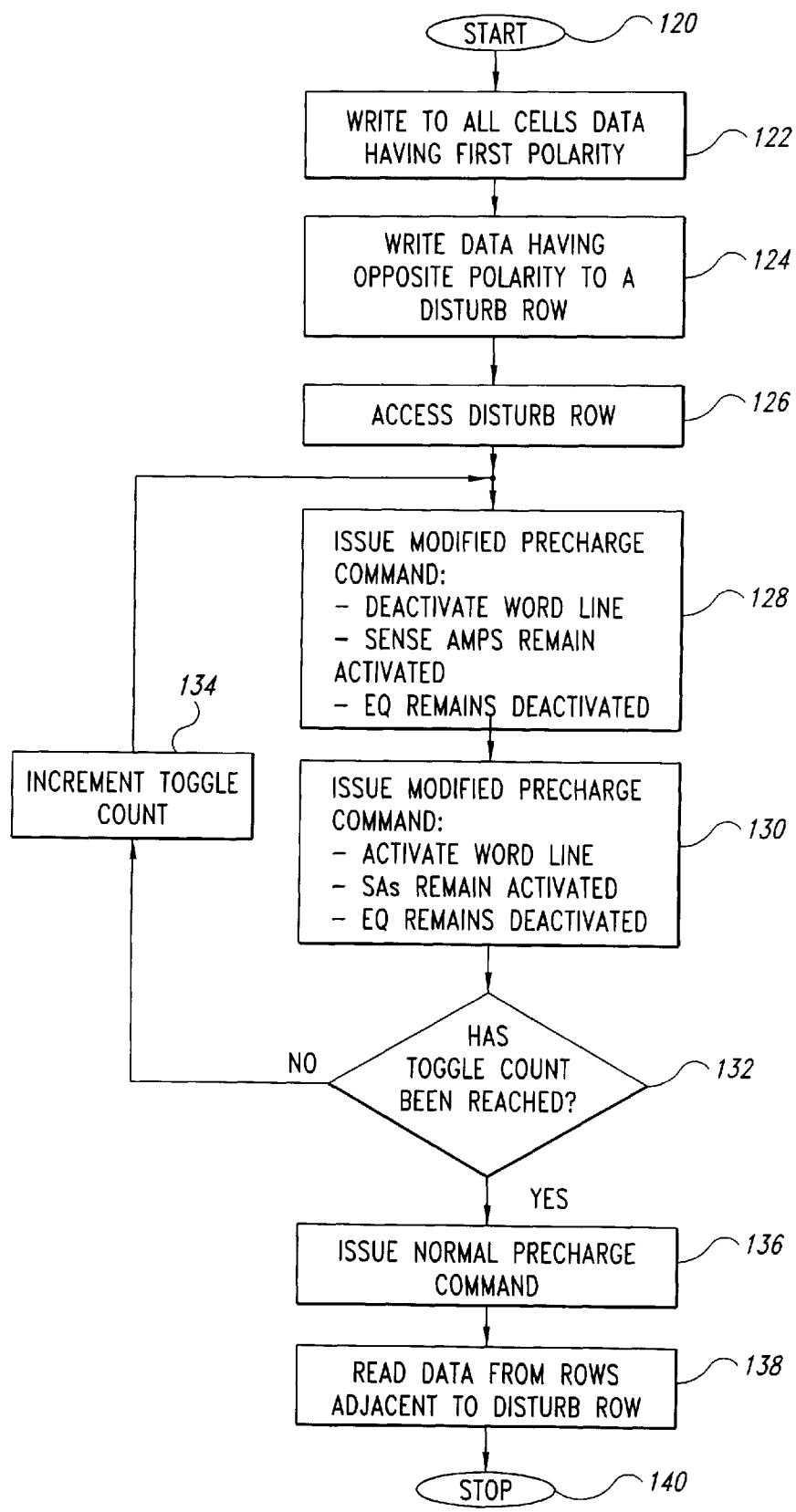
FIG. 3 illustrates a flowchart of a test procedure that may be performed by the memory device shown in FIG. 2.

Shown in FIG. 3 is a test procedure that evaluates the effect word line coupling has on the integrity of stored data. The test procedure begins at step 120, and in steps 122 through 126, the initial conditions for the test are established so that when the disturb row is accessed in step 126, the sense amplifiers 98 will amplify data having the opposite polarity to the data written to the rest of the array 96. The modified precharge commands issued to the command decoder 80 in steps 128 and 130 are used to modify the normal sequence of precharge events of the SDRAM 10. In step 128, the code present on address pins A<3>–A<5> when the modified precharge command is issued should be "011." In response, the precharge control circuit 110 will generate a high WL_OFF signal to deactivate the word line of the disturb row, and low SA_OFF* and EQ_OFF* signals to deactivate the sense amplifiers and inhibit the equilibration circuits 100. In step 130, the code is changed to "111" and another modified precharge signal is issued to reactivate the word line of the disturb row. Consequently, in steps 128 through 134, the word line of the disturb row is toggled high and low a predetermined number of times without deactivating the sense amplifiers or equilibrating the digit lines.

After the determination of step 132 is satisfied, a normal precharge command is issued at step 136, and the data from the rows having word lines physically adjacent to the word line of the disturb row are read in step 128. If there is severe coupling between the word line of the disturb row and the word lines of the physically adjacent rows, the cell transistors of the adjacent rows may be marginally activated during the toggling of the disturb row in steps 128 through 134. As a result, the data written to the cells of the adjacent rows may be altered by the data of the opposite polarity amplified on the digit lines by the sense amplifiers, which remained activated while the word line of the disturb row was toggled. The memory tester will detect the change in the expected data when reading the cells of the adjacent rows and flag the SDRAM 10 as a reject.

Figure 4:
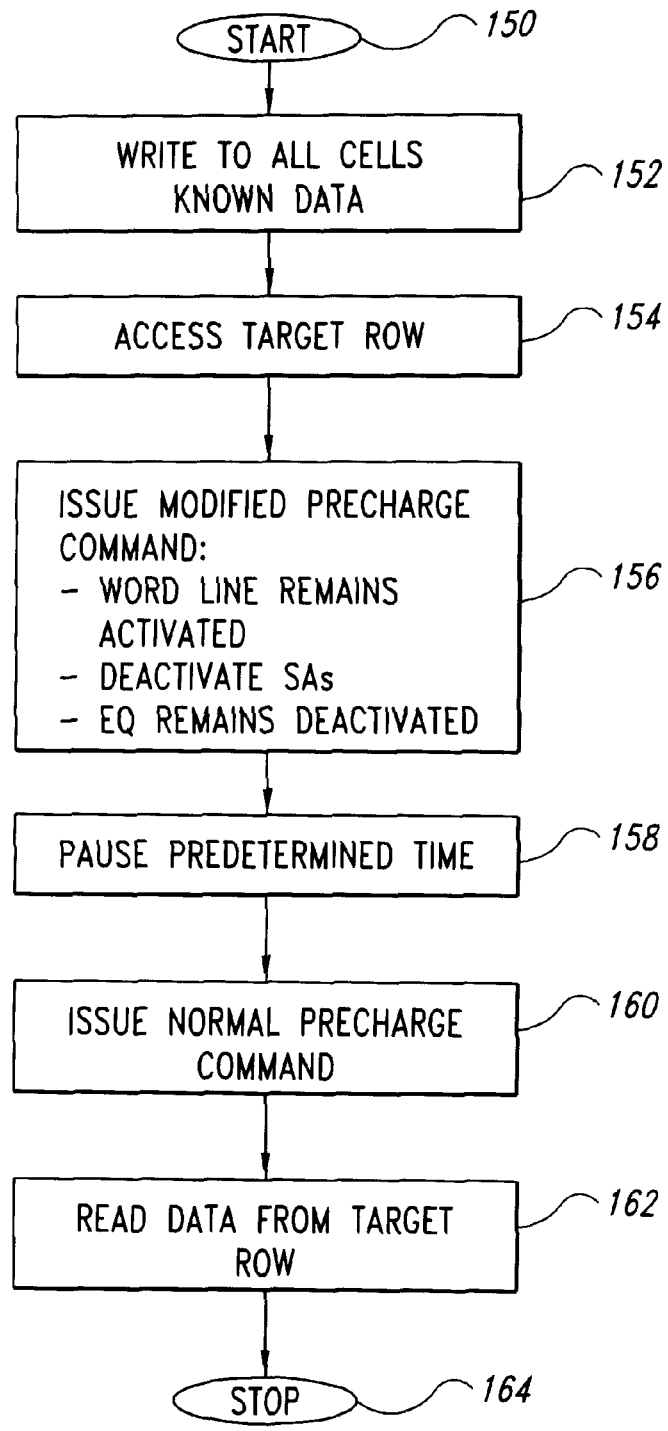
FIG. 4 illustrates a flowchart of a test procedure that may be performed by the memory device shown in FIG. 2.

Shown in FIG. 4 is a test procedure that may be used to determine if there is marginal digit line shorting. The test procedure starts at step 150 and the initial conditions for the test are established so that the target row is accessed in step 152, and the sense amplifiers 98 have amplified the data on the digit lines in step 154. In step 156, a modified precharge command is issued with the code "101" to keep the word line of the target row activated, deactivate the sense amplifiers, and suppress equilibration. As a result, the cells of the target row remain coupled to floating digit lines. After pausing a predetermined time in step 158, a normal precharge command is issued in step 160 to deactivate the word line of the target row and equilibrate the digit lines. When the word line is deactivated, the charge stored by the cells of the target row is the charge present on the floating digit lines at the end of the pause in step 158. Ideally, the data of the cells of the target row will not change after the pause because the digit lines should maintain a sufficient charge. However, if the digit lines are marginally shorted, the level of charge of one digit line may be affected by the level of charge of the digit line to which it is shorted. The effect of the shorting may be severe enough to change the data value stored by the cells of the target row. Consequently, when the cells of the target row are read in step 162, the digit shorting will result in the memory tester detecting a change in the expected data of the target row and rejecting the SDRAM 10. The test procedure completes at step 164.

Figure 5:
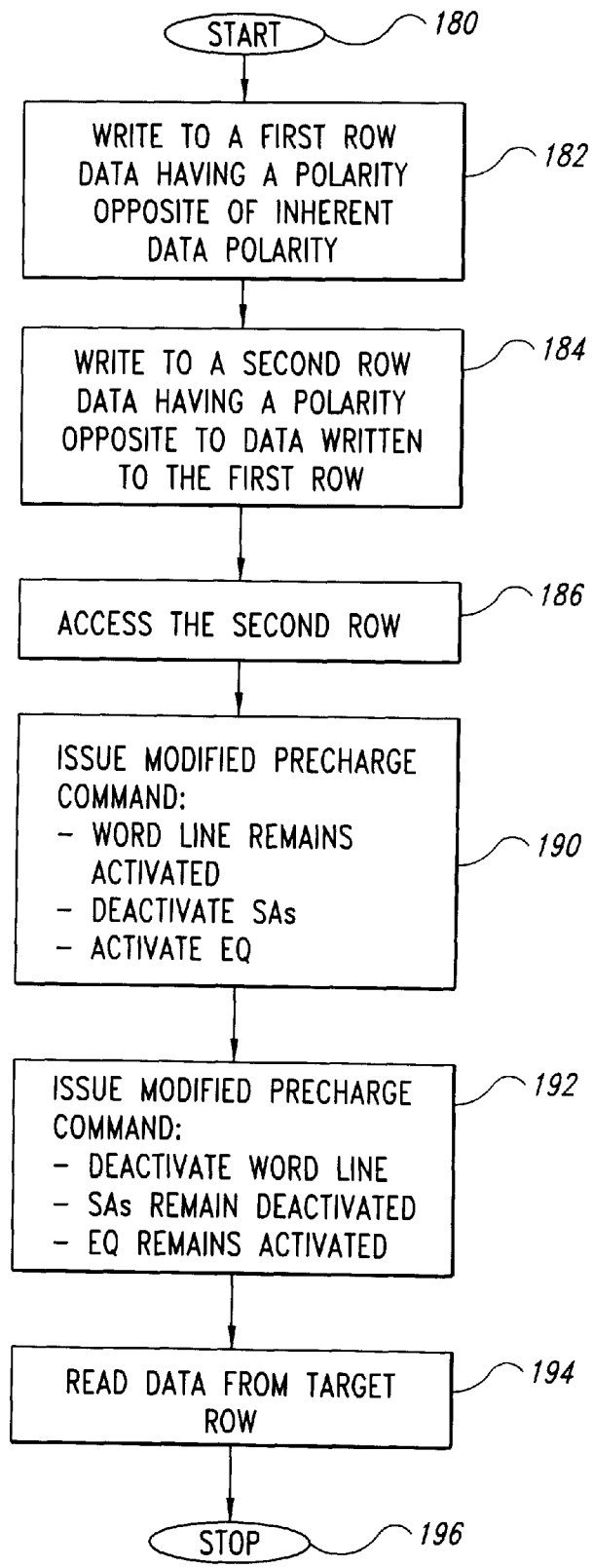
FIG. 5 illustrates a flowchart of a test procedure that may be performed by the memory device shown in FIG. 2.

Shown in FIG. 5 is a test procedure that may be used to determine whether the equilibration circuits 100 and the VCC/2 generator can effectively balance the digit lines under an increased capacitive load. The test procedure starts at step 150 and the initial conditions for the test are established by writing data of a first polarity to the cells of a first row in step 182, and data of the opposite polarity to a second row in step 184. When the second row is accessed in step 186, the sense amplifiers 98 have amplified the data on the digit lines. In step 190, a modified precharge command is issued to the command decoder 80 to keep the word line of the second row activated, thereby increasing the capacitive loading of the digit lines by having the cells of the second row remain coupled to the digit lines while equilibration occurs. The code that is present on A<3>–A<5> when the command is issued is "100." The word line is deactivated in step 192 by issuing another modified precharge command with the new code "000," and the cells of the first row are then read in step 194. The test procedure completes at step 196.

A marginal equilibration circuit or VCC/2 generator may not be able to compensate for the additional capacitive loading of step 190 to sufficiently balance the digit lines prior to the read command in step 194. If this is the case, when the cells of the first row are read, the data amplified by the sense amplifiers 98 will result from the charge of the cells of the second row remaining after the insufficient equilibration of step 190 and the charge of the cells of the first row accessed in step 194. Where the charge applied to the digit lines by the accessed cells of the first row is not sufficient to overcome the line imbalance of the insufficient equilibration, the resulting data read by the memory tester will be different than the expected data. Consequently, the memory tester will mark the SDRAM 10 as a reject.

Figure 6:
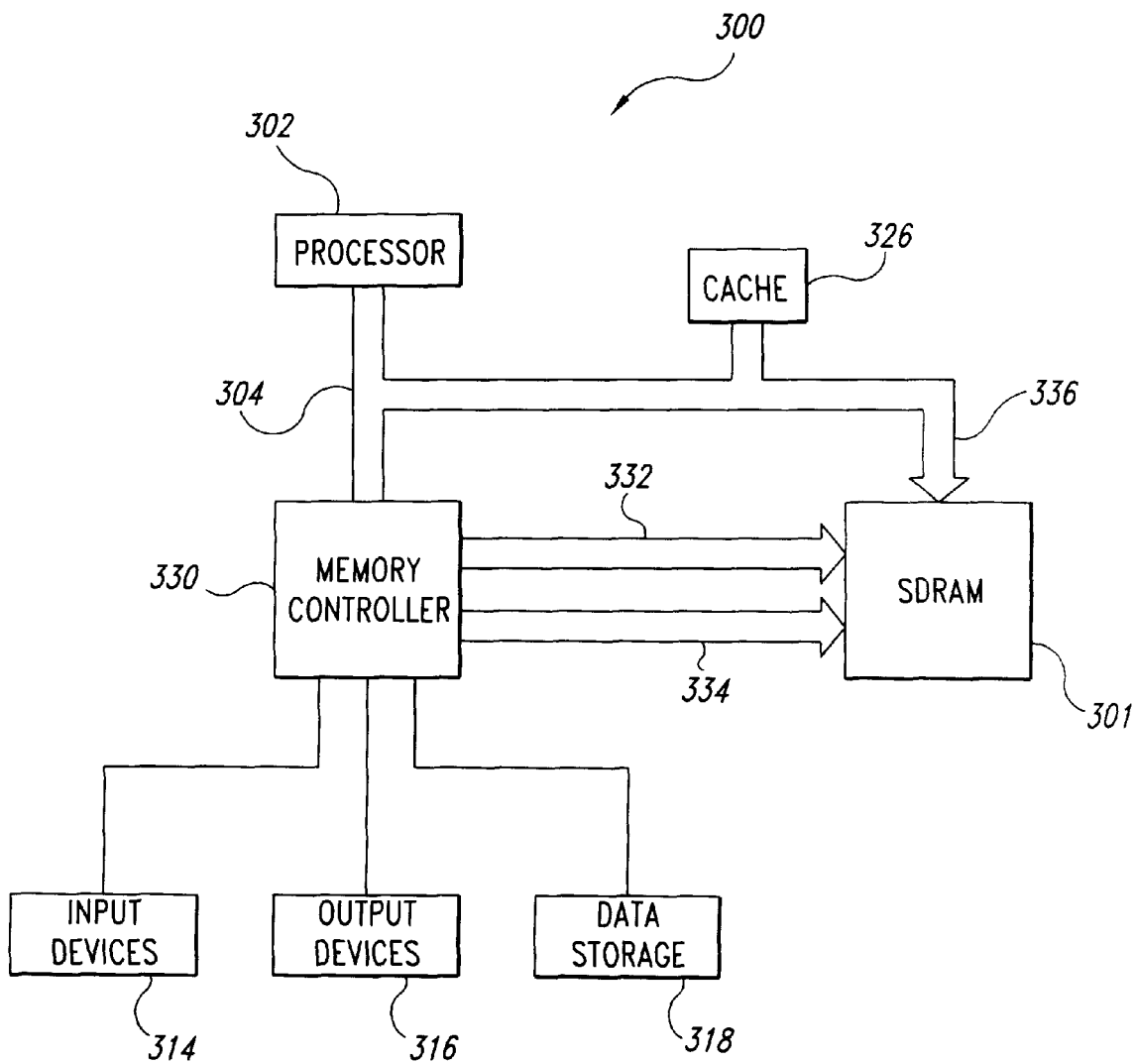
FIG. 6 is a block diagram of a computer system including the memory device of FIG. 2.

FIG. 6 is a block diagram of a computer system 300, which includes an SDRAM 301 having a command decoder 80 similar to that shown in FIG. 2. The computer system 300 includes a processor 302 for performing various computing functions, such as executing specific software to perform specific calculations or tasks. The processor 302 includes a processor bus 304 that includes an address bus, a control bus, and a data bus. In addition, the computer system 300 includes one or more input devices 314, such as a keyboard or a mouse, coupled to the processor 302 to allow an operator to interface with the computer system 300. The computer system 300 also includes one or more output devices 316 coupled to the processor 302, such as a printer or a video terminal. One or more data storage devices 318 may also be coupled to the processor 302 to allow the processor 302 to store data or retrieve data from internal or external storage media (not shown). Examples of typical storage devices 318 include hard and floppy disks, tape cassettes, and compact disk read-only memories ("CD-ROMs"). The processor 302 is also coupled to a cache memory 326, which is a static random access memory ("SRAM"), and to the SDRAM 301 through a memory controller 330. The memory controller 330 includes a control bus 332 and an address bus 334 which are coupled to the SDRAM 301. A data bus 336 is coupled between the SDRAM 301 and the processor bus 304.

From the foregoing it will be appreciated that, although specific embodiments of the invention have been described herein for purposes of illustration, various modifications may be made without deviating from the spirit and scope of the invention. For example, although the embodiments of the present invention have been described with respect to an SDRAM 10, they may be included in other types of memories as well, such as DRAMs, SRAMs, and SLDRAMs. Accordingly, the invention is not limited except as by the appended claims.

What is claimed is:

1. Operation control circuitry for a memory device having a memory cell array, the operational control circuitry comprising:

a command circuit generating control signals responsive to received command signals to cause a normal sequence of precharge operations to occur in the array; and a precharge control circuit having output terminals corresponding to the control signals coupled to the array and a mode terminal for receiving at least one mode signal, the precharge control circuit coupled to the command circuit to receive the control signals and to generate array control signals to alter the normal sequence of precharge operations of the array to an alternative sequence of precharge operations according to the mode signal in response to receiving the corresponding control signals and the mode signal.

2. The operation control circuitry of claim 1 wherein the mode signal comprises a test mode signal indicative of the memory device being in a first mode or a test mode, the test mode signal activating the precharge control circuit when indicative of the memory device being in the test mode.

3. The operation control circuitry of claim 2 wherein the mode terminal of the precharge control circuit is coupled to the command circuit to receive the test mode signal from the command circuit.

4. The operation control circuitry of claim 2 wherein the mode signal further comprises test code signals provided by a test code bus coupled to the precharge circuit, the test code signals programming the precharge control circuit to cause the alternative sequence of precharge operations.

5. The operation control circuitry of claim 4 wherein the test code signals comprise at least one address signal, and the test code bus is an address bus.

6. The operation control circuitry of claim 4 wherein the precharge control circuit further comprises a logic circuit coupled to the test code bus and to the command circuit for gating the control signals to the output terminals of the precharge control circuit as a function of the test code signals.

7. Precharge control circuitry for a memory device having a memory cell array arranged in rows of word lines and columns of pairs of complementary digit lines, the operation control circuit comprising:

a command circuit for generating a mode signal indicative of the memory device being in a first mode or a test mode, and further generating an activation signal responsive to receiving a modify command signal to initiate a normal sequence of precharge operations of the memory cell array;

a precharge code circuit generating a precharge code; and a precharge control circuit coupled to the precharge code circuit to receive the precharge code, and further coupled to the command circuit to receive the mode and activation signals, the precharge control circuit responding to a mode signal indicative of the test mode to generate a plurality of precharge control signals to alter the normal sequence of precharge operations to an alternative sequence of precharge operations by generating in accordance with the precharge code and in response to receiving the activation signal, the precharge control signals performing precharge operations of the memory cell array.

8. The precharge control circuitry of claim 7, further comprising a row decoder coupled to the word lines of the memory cell array, and further coupled to the precharge control circuit to receive the precharge control signals, the row decoder activating and deactivating the word lines in accordance with the precharge control signals.

9. The precharge control circuitry of claim 7, further comprising:

a row decoder coupled to the word lines of the memory cell array, and further coupled to the precharge control circuit to receive the precharge control signals, the row decoder activating and deactivating the word lines in accordance with the precharge control signals; and a bank of sense amplifiers coupled to the pairs of complementary digit lines of the memory cell array, and further coupled to the precharge control circuit to receive the precharge control signals, the bank of sense amplifiers being activated and deactivated in accordance with the precharge control signals.

10. The precharge control circuitry of claim 7, further comprising:

a row decoder coupled to the word lines of the memory cell array, and further coupled to the precharge control circuit to receive the precharge control signals, the row decoder activating and deactivating the word lines in accordance with the precharge control signals;

a bank of sense amplifiers coupled to the pairs of complementary digit lines of the memory cell array, and further coupled to the precharge control circuit to receive the precharge control signals, the bank of sense amplifiers being activated and deactivated in accordance with the precharge control signals; and an equilibration circuit coupled to the pairs of complementary digit lines of the memory cell array, and further coupled to the precharge control circuit to receive the precharge control signals, the equilibration circuit being activated and deactivated in accordance with the precharge control signals.

11. The precharge control circuitry of claim 7 wherein the command circuit comprises a command decoder.

12. The precharge control circuitry of claim 7 wherein the precharge code circuit comprises an address register coupled to an address bus, and the precharge code comprises at least one of the address signals provided by the address register.

13. A precharge modification circuit for altering a sequence of precharge operations of a memory cell array in a memory device while in a test mode, the precharge modification circuit comprising:

a command circuit means for generating control signals to cause precharge operations to occur in the memory cell array;

a precharge circuit means for precharging the memory cell array; and a precharge control circuit means coupled to the command circuit means and having a mode terminal for receiving at least one mode signal, the precharge control means for gating the control signals to the precharge circuits means in accordance with the mode signal to suppress or enable precharge operations of the memory cell array that occur according to the sequence of precharge operations.

14. The precharge modification circuit of claim 13 wherein the mode signal comprises a test mode signal indicative of the memory device being in the test mode.

15. The precharge modification circuit of claim 13 wherein the mode signal comprises a test mode signal indicative of the memory device being in the test mode, and a precharge code signal for programming the precharge control circuit means to a particular precharge mode.

16. The precharge modification circuit of claim 15 wherein the command circuit means is a command decoder and the precharge control circuit means is further coupled to an address bus to receive at least one address signal as the precharge code signal.

17. The precharge modification circuit of claim 13 wherein the precharge circuit means comprises a row decoder coupled to word lines of the memory cell array.

18. The precharge modification circuit of claim 13 wherein the precharge circuit means comprises:
a row decoder coupled to word lines of the memory cell array; and
a plurality of sense amplifiers coupled to a corresponding plurality of complementary digit lines of the memory cell array.

19. The precharge modification circuit of claim 13 wherein the precharge circuit means comprises:
a row decoder coupled to word lines of the memory cell array;
a plurality of sense amplifiers coupled to a corresponding plurality of complementary digit lines of the memory cell array; and
a plurality of equilibration circuits coupled to the plurality of complementary digit lines.

20. A memory device, comprising:
an address bus;
a control bus;
a data bus;
an address decoder coupled to the address bus;
a control circuit coupled to the control bus;
a read/write circuit coupled to the data bus;
a memory cell array; and
an operation control circuit, including,
a command circuit generating control signals responsive to received command signals to cause a normal sequence of precharge operations to occur in the array; and
a precharge control circuit having output terminals corresponding to the control signals coupled to the array and a mode terminal for receiving at least one mode signal, the precharge control circuit coupled to the command circuit to receive the control signals and to generate array control signals to alter the normal sequence of precharge operations of the array to an alternative sequence of precharge operations according to the mode signal in response to receiving the corresponding control signals and the mode signal.

21. The memory device of claim 20 wherein the mode signal comprises a test mode signal indicative of the memory device being in a first mode or a test mode, the test mode signal activating the precharge control circuit when indicative of the memory device being in the test mode.

22. The memory device of claim 21 wherein the mode terminal of the precharge control circuit is coupled to the command circuit to receive the test mode signal from the command circuit.

23. The memory device of claim 21 wherein the mode signal further comprises test code signals provided by a test code bus coupled to the precharge circuit, the test code signals programming the precharge control circuit to a particular precharge mode.

24. The memory device of claim 23 wherein the test code signals comprise at least one address signal, and the test code bus is an address bus.

25. The memory device of claim 23 wherein the precharge control circuit further comprises a logic circuit coupled to the test code bus and to the command circuit for gating the control signals to the output terminals of the precharge control circuit as a function of the test code signals.

26. A computer system, comprising:
a data input device;
a data output device; and
computing circuitry coupled to the data input and output devices, and further having at least one memory device including,
an address bus;
a control bus;
a data bus;
an address decoder coupled to the address bus;
a control circuit coupled to the control bus;
a read/write circuit coupled to the data bus;
a memory cell array; and
an operation control circuit, including,
a command circuit generating control signals responsive to received command signals to cause a normal sequence of precharge operations to occur in the array; and
a precharge control circuit having output terminals corresponding to the control signals coupled to the array and a mode terminal for receiving at least one mode signal, the precharge control circuit coupled to the command circuit to receive the control signals and to generate array control signals to alter the normal sequence of precharge operations of the array to an alternative sequence of precharge operations according to the mode signal in response to receiving the corresponding control signals and the mode signal.

27. The computer system of claim 26 wherein the mode signal comprises a test mode signal indicative of the memory device being in a first mode or a test mode, the test mode signal activating the precharge control circuit when indicative of the memory device being in the test mode.

28. The computer system of claim 27 wherein the mode terminal of the precharge control circuit is coupled to the command circuit to receive the test mode signal from the command circuit.

29. The computer system of claim 27 wherein the mode signal further comprises test code signals provided by a test code bus coupled to the precharge circuit, the test code signals programming the precharge control circuit to a particular precharge mode.

30. The computer system of claim 29 wherein the test code signals comprise at least one address signal, and the test code bus is an address bus.

31. The computer system of claim 29 wherein the precharge control circuit further comprises a logic circuit coupled to the test code bus and to the command circuit for gating the control signals to the output terminals of the precharge control circuit as a function of the test code signals.

32. A method of altering a normal sequence of precharge operations of a memory cell array in a memory device while in a test mode, the method comprising:

generating control signals to cause precharge operations to occur in the memory cell array;

enabling a precharge control circuit in response to receiving at least one mode signal; and gating the control signals to precharge circuits of the array to alter the normal sequence of precharge operations of the memory cell array to an alternative sequence of precharge operations in accordance with the mode signal.

33. The method of claim 32 wherein enabling comprises providing the precharge control circuit with the mode signal including a test mode signal indicative of the memory device being in the test mode.

34. The method of claim 32 wherein enabling comprises providing the precharge control circuit with the mode signal including a test mode signal indicative of the memory device being in the test mode, and a precharge code signal for programming the precharge control circuit to a particular precharge mode.

35. The method of claim 34 wherein the test mode signal is provided by a command decoder and the precharge code signal comprises at least one address signal provided by an address bus.

36. The method of claim 32 wherein generating control signals comprises generating in response to receiving command signals by a command decoder a word line deactivation signal to deactivate a word line of the memory cell array.

37. The method of claim 32 wherein generating control signals comprises generating in response to receiving command signals by a command decoder a word line deactivation signal to deactivate a word line of the memory cell array, and a sense amplifier deactivation signal to deactivate sense amplifiers coupled to the memory cell array.

38. The method of claim 32 wherein generating control signals comprises generating in response to receiving command signals by a command decoder a word line deactivation signal to deactivate a word line of the memory cell array, a sense amplifier deactivation signal to deactivate sense amplifiers coupled to the memory cell array, and an equilibration activation signal to activate equilibration circuits coupled to the memory cell array.

39. A method of altering a normal sequence of precharge operations of a memory cell array of a memory device in a test mode, the method comprising:

enabling an precharge control circuit in response to the memory device being in the test mode and a command circuit receiving a modify command signal;

strobing the logic state of at least one signal present on a precharge code bus to determine a precharge code;

generating precharge control signals to alter the normal sequence of precharge operations of the memory cell array to an alternative sequence of precharge operations according to the precharge code.

40. The method of claim 39 wherein generating precharge control signals comprises generating a first precharge control signal to control a row decoder activating and deactivating word lines of a memory array in accordance with the precharge code.

41. The method of claim 40 wherein generating operation control signals further comprises generating a second precharge control signal to control activation and deactivation of a plurality of sense amplifiers coupled to a corresponding plurality of complementary digit lines of the memory cell array in accordance with the precharge code.

42. The method of claim 41 wherein generating operation control signals further comprises generating a third precharge control signal to control activation and deactivation of a plurality of equilibration circuits coupled to the complementary digit lines of the memory cell array in accordance with the precharge code.

43. The method of claim 39 wherein strobing the logic state comprises strobing an address bus coupled to an address register for the precharge code.

* * * * *